(12) United States Patent
Rui et al.

(10) Patent No.: US 11,600,642 B2
(45) Date of Patent: Mar. 7, 2023

(54) LAYER STACK FOR DISPLAY APPLICATIONS

(71) Applicant: Applied Materials, Inc., Santa Clara, CA (US)

(72) Inventors: Xiangxin Rui, Campbell, CA (US); Soo Young Choi, Fremont, CA (US); Shinichi Kurita, San Jose, CA (US); Yujia Zhai, Fremont, CA (US); Lai Zhao, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/332,766

(22) Filed: May 27, 2021

(65) Prior Publication Data
US 2021/0288084 A1 Sep. 16, 2021

Related U.S. Application Data

(63) Continuation of application No. 15/889,047, filed on Feb. 5, 2018, now Pat. No. 11,049,887.
(Continued)

(51) Int. Cl.
*H01L 27/12* (2006.01)
*H01L 49/02* (2006.01)
(Continued)

(52) U.S. Cl.
CPC .......... *H01L 27/1262* (2013.01); *C23C 16/40* (2013.01); *C23C 16/45544* (2013.01);
(Continued)

(58) Field of Classification Search
CPC ............ H01L 27/1262; H01L 27/1222; H01L 27/1255; H01L 27/1248; H01L 27/3262;
(Continued)

(56) References Cited

U.S. PATENT DOCUMENTS 6,660,549 B2 12/2003 Yamazaki et al.
6,724,513 B2 4/2004 Murade
(Continued)

FOREIGN PATENT DOCUMENTS

KR 20110068631 A 6/2011
KR 10-2012-0102723 A 9/2012
(Continued)

OTHER PUBLICATIONS

Korean Office Action dated Oct. 22, 2021 for Application No. 10-2020-7015818.
(Continued)

*Primary Examiner* — Monica D Harrison
*Assistant Examiner* — Lawrence C Tynes, Jr.
(74) *Attorney, Agent, or Firm* — Patterson + Sheridan, LLP

(57) ABSTRACT

Embodiments of the present disclosure generally relate to a layer stack including a high K dielectric layer formed over a first dielectric layer and a metal electrode. The high K dielectric layer has a K value of 20 or higher and may be formed as a part of a capacitor, a gate insulating layer, or any suitable insulating layer in electronic devices, such as display devices. The layer stack includes a second dielectric layer disposed on the first dielectric layer and the metal layer, and the high K dielectric layer containing zirconium dioxide or hafnium dioxide disposed on the second dielectric layer. The second dielectric layer provides a homogenous surface on which the high K dielectric layer is formed. The homogeneous surface enables the high K dielectric material to be deposited uniformly thereover, resulting in a uniform thickness profile.

20 Claims, 4 Drawing Sheets

Related U.S. Application Data

(60) Provisional application No. 62/584,417, filed on Nov. 10, 2017.

(51) Int. Cl.
| | |
|---|---|
| *H01L 29/49* | (2006.01) |
| *H01L 29/786* | (2006.01) |
| *H01L 21/02* | (2006.01) |
| *H01J 37/32* | (2006.01) |
| *C23C 16/40* | (2006.01) |
| *C23C 16/50* | (2006.01) |
| *C23C 16/455* | (2006.01) |
| *C23C 16/52* | (2006.01) |
| *C23C 16/56* | (2006.01) |
| *H01L 21/687* | (2006.01) |
| *H01L 21/67* | (2006.01) |
| *H01L 27/32* | (2006.01) |

(52) U.S. Cl.
CPC ............ *C23C 16/50* (2013.01); *C23C 16/52* (2013.01); *C23C 16/56* (2013.01); *H01J 37/32899* (2013.01); *H01L 21/0217* (2013.01); *H01L 21/0228* (2013.01); *H01L 21/02164* (2013.01); *H01L 21/02178* (2013.01); *H01L 21/02181* (2013.01); *H01L 21/02186* (2013.01); *H01L 21/02189* (2013.01); *H01L 21/02192* (2013.01); *H01L 21/02274* (2013.01); *H01L 21/02304* (2013.01); *H01L 21/02318* (2013.01); *H01L 21/67167* (2013.01); *H01L 21/68742* (2013.01); *H01L 27/124* (2013.01); *H01L 27/1222* (2013.01); *H01L 27/1248* (2013.01); *H01L 27/1255* (2013.01); *H01L 28/60* (2013.01); *H01L 29/4908* (2013.01); *H01L 29/78675* (2013.01); *H01J 2237/332* (2013.01); *H01L 27/3244* (2013.01); *H01L 27/3262* (2013.01)

(58) Field of Classification Search
CPC ............ H01L 27/3265; H01L 27/101; H01L 27/0805; H01L 27/0794; H01L 27/0788; H01L 27/0733; H01L 27/0727; H01L 27/0722; H01L 27/0716; H01L 27/0682; H01L 27/0676; H01L 27/0629; H01L 21/02164; H01L 21/02318; H01L 21/0228; H01L 21/02274; H01L 21/0217; H01L 21/02181; H01L 21/02189; H01L 21/02192; H01L 21/02186; H01L 21/02178; H01L 21/02131; H01L 21/02145; H01L 21/02148; H01L 21/02156; H01L 21/02142; H01L 21/02159; H01L 21/02153; H01L 29/78675; H01L 29/4908; H01L 28/60; H01L 28/05–57; H01L 28/82–92; C23C 16/56; C23C 16/52; C23C 16/45544; C23C 16/50; C23C 16/40; H01J 37/32899; H01J 2237/332

See application file for complete search history.

(56) References Cited

U.S. PATENT DOCUMENTS

| | | |
|---|---|---|
| 6,953,721 B2 | 10/2005 | Agarwal |
| 7,108,747 B1 | 9/2006 | Leskela et al. |
| 7,732,819 B2 | 6/2010 | Akimoto et al. |
| 7,821,002 B2 | 10/2010 | Yamazaki et al. |
| 8,129,721 B2 | 3/2012 | Yamazaki et al. |
| 8,207,756 B2 | 6/2012 | Shionoir et al. |
| 8,471,256 B2 | 6/2013 | Yamazaki et al. |
| 8,507,911 B2 | 8/2013 | Kim et al. |
| 8,815,677 B2 | 8/2014 | Chen et al. |
| 9,082,857 B2 | 7/2015 | Yamazaki et al. |
| 9,105,659 B2 | 8/2015 | Yamazaki et al. |
| 9,136,315 B1 | 9/2015 | Kim et al. |
| 9,166,058 B2 | 10/2015 | Miyairi et al. |
| 9,236,456 B2 | 1/2016 | Miyairi et al. |
| 9,499,571 B2 | 11/2016 | Lansalot-Matras et al. |
| 9,646,829 B2 | 5/2017 | Ohno et al. |
| 9,755,009 B2 | 9/2017 | You et al. |
| 2002/0074586 A1 | 6/2002 | Harris et al. |
| 2003/0222261 A1 | 12/2003 | Murade |
| 2011/0127524 A1* | 6/2011 | Yamazaki ........... H01L 29/7869 257/43 |
| 2012/0225543 A1 | 9/2012 | Ohno et al. |
| 2012/0267611 A1 | 10/2012 | Chung et al. |
| 2013/0048994 A1 | 2/2013 | Choi et al. |
| 2013/0208403 A1 | 8/2013 | Rocklein et al. |
| 2013/0217202 A1 | 8/2013 | Malhotra et al. |
| 2013/0240864 A1 | 9/2013 | Ha et al. |
| 2015/0110958 A1 | 4/2015 | Lansalot-Matras et al. |
| 2015/0194634 A1 | 7/2015 | Kang et al. |
| 2015/0303280 A1 | 10/2015 | Yamazaki et al. |
| 2016/0079438 A1* | 3/2016 | Miyairi .................. H01L 29/263 257/43 |
| 2016/0104762 A1* | 4/2016 | Triyoso .................. H01L 28/60 257/532 |
| 2016/0300902 A1 | 10/2016 | You et al. |
| 2017/0229554 A1 | 8/2017 | Choi et al. |
| 2018/0026055 A1 | 1/2018 | Rui et al. |
| 2019/0148416 A1 | 5/2019 | Rui et al. |

FOREIGN PATENT DOCUMENTS

| | | |
|---|---|---|
| KR | 20130021607 A | 3/2013 |
| KR | 20160120387 A | 10/2016 |
| KR | 20170098850 A | 8/2017 |

OTHER PUBLICATIONS

PCT Notification of Transmittal of the International Search Report and the Written Opinion of the International Searching Authority for International Application No. PCT/US2018/050866; dated Jan. 2, 2019; 13 total pages.

Korean Office Action dated Aug. 21, 2022 for Application No. 10-2022-7026066.

Taiwan Office Action dated Oct. 13, 2022 for Application No. 107134605.

\* cited by examiner

LAYER STACK FOR DISPLAY APPLICATIONS

CROSS-REFERENCE TO RELATED APPLICATIONS

This application is a continuation of U.S. application Ser. No. 15/889,047, filed Feb. 5, 2018, which claims benefit of U.S. Prov. Appl. No. 62/584,417, filed Nov. 10, 2017, which are incorporated by reference herein.

BACKGROUND

Field

Embodiments of the present disclosure generally relate to a layer stack including a dielectric layer having a high dielectric constant (high K) value for display devices. More particularly, embodiments of the present disclosure relate to a layer stack including a dielectric layer having a high K value deposited over a surface having a metal material and a dielectric material.

Description of the Related Art

Display devices have been widely used for a wide range of electronic applications, such as TVs, monitors, mobile phone, MP3 players, e-book readers, personal digital assistants (PDAs) and the like. In some devices, capacitors, such as metal-insulator-metal (MIM) capacitors, are often utilized and formed to store electric charges when the display devices are in operation. The capacitors hold the electrical charge to maintain the gate voltage of the driving thin film transistor (TFT), so that the brightness is defined for each pixel for each frame. The storage capacitor in the TFT circuit usually is a MIM structure including a dielectric layer disposed between two metal electrodes. The capacitor as formed is required to have high capacitance for display devices. The capacitance may be adjusted by changing the dielectric material and/or the dimensions of the dielectric layer. For example, when the dielectric layer is replaced with a material having a higher K value, the capacitance will increase as well. Zirconium dioxide ($ZrO_2$) has a K value ranging from about 20 to about 50 and is a candidate as the dielectric layer in the capacitor. However, a $ZrO_2$ layer deposited on surfaces having both a metal portion, such as metal interconnects, and a dielectric portion, such as silicon nitride (SiN), results in a $ZrO_2$ layer having a non-uniform thickness profile due to the different deposition rates of the high K dielectric layer on the metal portion and on the dielectric portion. The high K dielectric layer having a non-uniform thickness profile can lead to over and/or under etch during subsequent patterning processes of the high K dielectric layer.

Therefore, there is a need for a solution to enable formation of a high K layer having a uniform thickness profile in applications where the high K layer is formed over a surface having different materials.

SUMMARY

Embodiments of the present disclosure generally relate to a layer stack including a dielectric layer having a high K value over a surface having a metal material and a dielectric material. In one embodiment, a structure including a first dielectric layer, a metal electrode disposed on the first dielectric layer, and a layer stack disposed on the first dielectric layer and the metal electrode. The layer stack includes a second dielectric layer disposed on the first dielectric layer and the metal electrode, and a high K dielectric layer disposed on the second dielectric layer.

In another embodiment, a method for forming a high K dielectric layer over a dielectric surface and metal surface including depositing a first dielectric layer on a second dielectric layer and a metal electrode, depositing a high K dielectric layer on the first dielectric layer, and annealing the high K dielectric layer.

In another embodiment, a system including a transfer chamber, a plasma enhanced atomic layer deposition chamber coupled to the transfer chamber, a thermal treatment chamber coupled to the transfer chamber, and a controller to perform steps of depositing a first dielectric layer on a second dielectric layer and a metal electrode in the plasma enhanced atomic layer deposition chamber, depositing a high K dielectric layer on the first dielectric layer in the plasma enhanced atomic layer deposition chamber, and annealing the high K dielectric layer in the thermal treatment chamber.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a layer stack including a high K dielectric layer formed over a first dielectric layer and a metal electrode. The high K dielectric layer has a K value of 20 or higher and may be formed as a part of a capacitor, a gate insulating layer, or any suitable insulating layer in electronic devices, such as display devices. The layer stack includes a second dielectric layer disposed on the first dielectric layer and the metal layer, and the high K dielectric layer disposed on the second dielectric layer. The second dielectric layer provides a homogenous surface on which the high K dielectric layer is formed. The homogeneous surface enables the high K dielectric material to be deposited uniformly thereover, resulting in a uniform thickness profile. The layer stack can be deposited in an integrated processing platform which includes at least a deposition chamber for one or more layers deposited and at least one anneal chamber to anneal one or more layers deposited.

The terms "over," "thereover," "under," "between," "on" and "thereon" as used herein refer to a relative position of one layer with respect to other layers. As such, for example, one layer disposed over or under another layer may be directly in contact with the other layer or may have one or more intervening layers. Moreover, one layer disposed between layers may be directly in contact with the two layers or may have one or more intervening layers. In contrast, a first layer "on" a second layer is in contact with the second layer. Additionally, the relative position of one layer with respect to other layers is provided assuming operations are performed relative to a substrate without consideration of the absolute orientation of the substrate.

Figure 1:
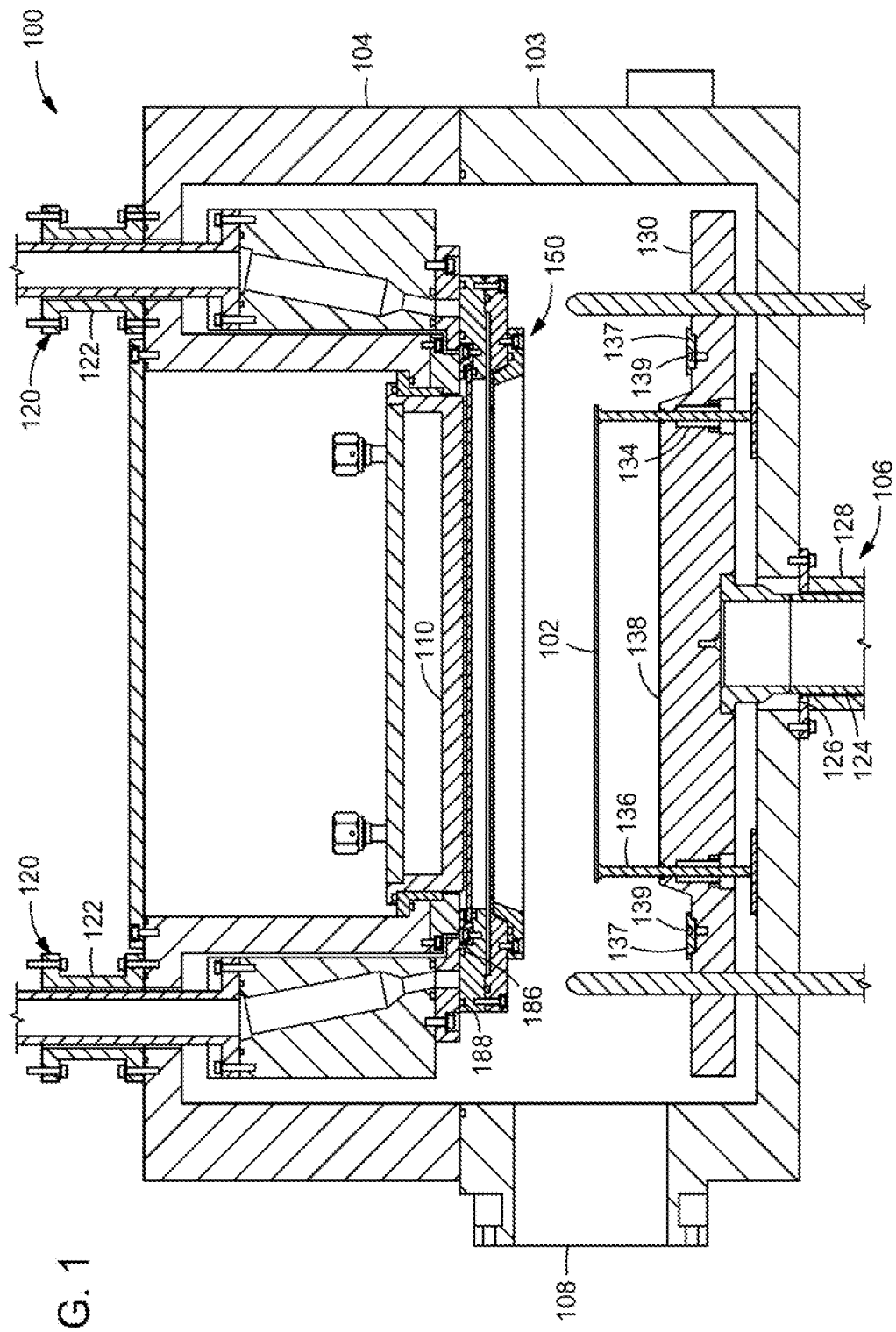
FIG. 1 is a cross-sectional view of a processing chamber that may be used to deposit a dielectric layer in accordance with one embodiment of the present disclosure.

FIG. 1 is a schematic cross sectional view of an atomic layer deposition (ALD) chamber 100 that may be used to practice embodiments discussed herein. The ALD chamber 100 may be a plasma enhanced ALD (PE-ALD) chamber. In one embodiment, a dielectric layer and a high K dielectric layer distinct from the dielectric layer in display devices are both formed in the chamber 100. The chamber 100 generally includes an enclosure defined by a chamber body 103, and a lid assembly 104. A substrate support assembly 106 and a process kit 150 are disposed within the enclosure. The lid assembly 104 is disposed on the chamber body 103, and the substrate support assembly 106 is at least partially disposed within the chamber body 103. The chamber body 103 includes a slit valve opening 108 formed in a sidewall thereof to provide access to the interior of the processing chamber 100. In some embodiments, the chamber body 103 includes one or more apertures that are in fluid communication with a vacuum system (e.g., a vacuum pump). The apertures provide an egress for gases within the chamber 100. The lid assembly 104 includes one or more differential pump and purge assemblies 120. The differential pump and purge assemblies 120 are mounted to the lid assembly 104 with bellows 122. The bellows 122 allow the pump and purge assemblies 120 to move vertically with respect to the lid assembly 104 while still maintaining a seal against gas leaks. When the process kit 150 is raised into a processing position, a first seal 186 and a second seal 188 on the process kit 150 are brought into contact with the differential pump and purge assemblies 120. The differential pump and purge assemblies 120 are connected with a vacuum system (not shown) and maintained at a low pressure.

As shown in FIG. 1, the lid assembly 104 includes a RF cathode 110 that can generate a plasma of reactive species within the chamber 100 and/or within the process kit 150. The RF cathode 110 may be heated by electric heating elements (not shown), and cooled by circulation of cooling fluids. Any power source capable of activating the gases into reactive species and maintaining the plasma of reactive species may be used. For example, RF or microwave (MW) based power discharge techniques may be used. The activation may also be generated by a thermally based technique, a gas breakdown technique, a high intensity light source (e.g., UV energy), or exposure to an x-ray source.

The substrate support assembly 106 can be at least partially disposed within the chamber body 103. The substrate support assembly 106 includes a substrate support member or susceptor 130 to support the substrate 102 for processing within the chamber body 103. The susceptor 130 is coupled to a substrate lift mechanism (not shown) through a shaft 124 which extends through one or more openings 126 formed in a bottom surface of the chamber body 103. The substrate lift mechanism is flexibly sealed to the chamber body 103 by a bellows 128 that prevents vacuum leakage from around the shaft 124. The substrate lift mechanism allows the susceptor 130 to be moved vertically within the chamber 100 between a lower robot entry position, as shown, and processing, process kit transfer, and substrate transfer positions. In some embodiments, the substrate lift mechanism moves between fewer positions than those described.

As shown in FIG. 1, the susceptor 130 includes one or more bores 134 through the susceptor 130 to accommodate one or more lift pins 136. Each lift pin 136 is mounted so that the lift pin 136 may slide freely within a bore 134. The support assembly 106 is movable such that the upper surface of the lift pins 136 can be located above the substrate support surface 138 of the susceptor 130 when the support assembly 106 is in a lower position. Conversely, the upper surface of the lift pins 136 is located below or substantially planar with the upper substrate support surface 138 of the susceptor 130 when the support assembly 106 is in a raised position. When contacting the chamber body 103, the lift pins 136 push against a lower surface of the substrate 102, lifting the substrate off the susceptor 130. Conversely, the susceptor 130 may raise the substrate 102 off of the lift pins 136.

In some embodiments, the susceptor 130 includes process kit insulation buttons 137 that may include one or more seals 139. The process kit insulation buttons 137 may be used to carry the process kit 150 on the susceptor 130. The one or more seals 139 in the process kit insulation buttons 137 are compressed when the susceptor lifts the process kit 150 into the processing position.

Figure 2:
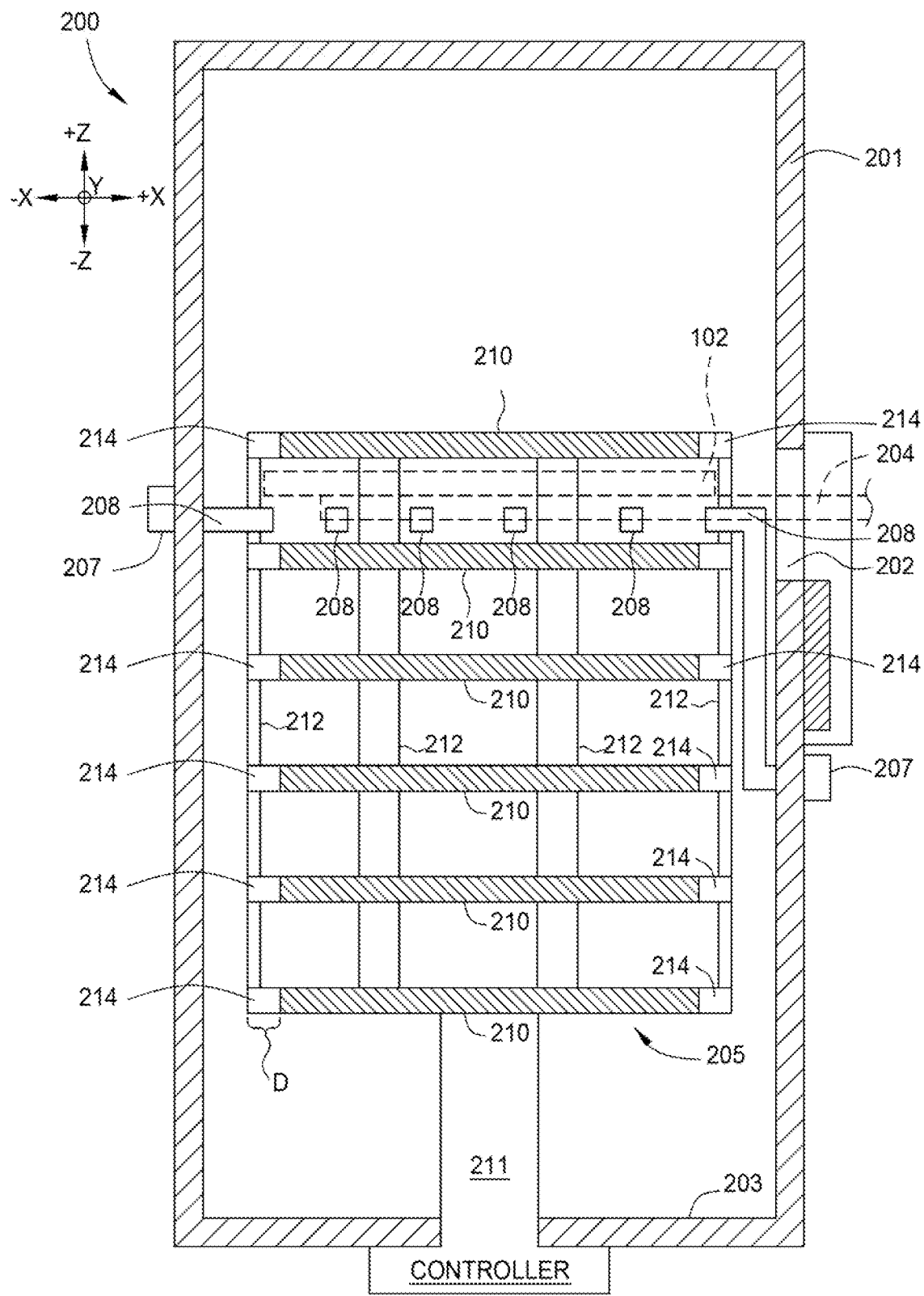
FIG. 2 is a cross-sectional view of a thermal treatment chamber that may be used to treat a dielectric layer in accordance with one embodiment of the present disclosure.

FIG. 2 is a cross-sectional view of a thermal treatment chamber 200 that may be utilized for heating multiple substrates 102, for example in an annealing process. The thermal treatment chamber 200 comprises an enclosure defined by a chamber body 201 having a bottom 203 and a slit valve opening 202. The slit valve opening 202 is formed through a sidewall of the chamber body 201 to permit an end effector 204 (shown in phantom) to enter and exit the thermal treatment chamber 200 and deliver or retrieve a substrate 102 (also shown in phantom) from a substrate support assembly 205. The substrate support assembly 205 is coupled to a shaft 211 disposed through the bottom 203 of the chamber body 201. The shaft 211 raises and lowers the substrate support assembly 205 in the Z direction relative to the slit valve opening 202. The substrate support assembly 205 comprises a plurality of heating plate structures 210. The heating plate structures 210 are coupled together by one or more supporting bars 212 that maintain the heating plate structures 210 in a fixed position relative to an adjacent heating plate structure 210. The supporting bars 212 are disposed at various locations along the perimeter of the heating plate structures 210. The supporting bars 212 are spaced along the perimeter of the heating plate structures 210 to allow passage of a plurality of support fingers 208 as further described below. The substrate support assembly 205, which includes all of the heating plate structures 210 and the supporting bars 212, move as a single structure within the thermal treatment chamber 200.

The support fingers 208 are coupled to actuators 207. The actuators 207 move the support fingers 208 in at least a lateral direction (e.g., at a transverse non-zero angle relative to the Z direction, for example in at least one of the X and Y directions) relative to the longitudinal axis of the chamber body 201 to control the extension distance of the support fingers 208 relative to the chamber body 201. Each of the heating plate structures 210 include slots 214 formed therein to allow passage of the support fingers 208 when the substrate support assembly 205 is moved vertically. The distance that each of the support fingers 208 extend inwardly from the chamber body 201 is commensurate with a depth D of each of the slots 214 to allow passage of a distal end (i.e., innermost end) of the support fingers 208 when the heating plate structure 210 is moved there past.

Figure 3:
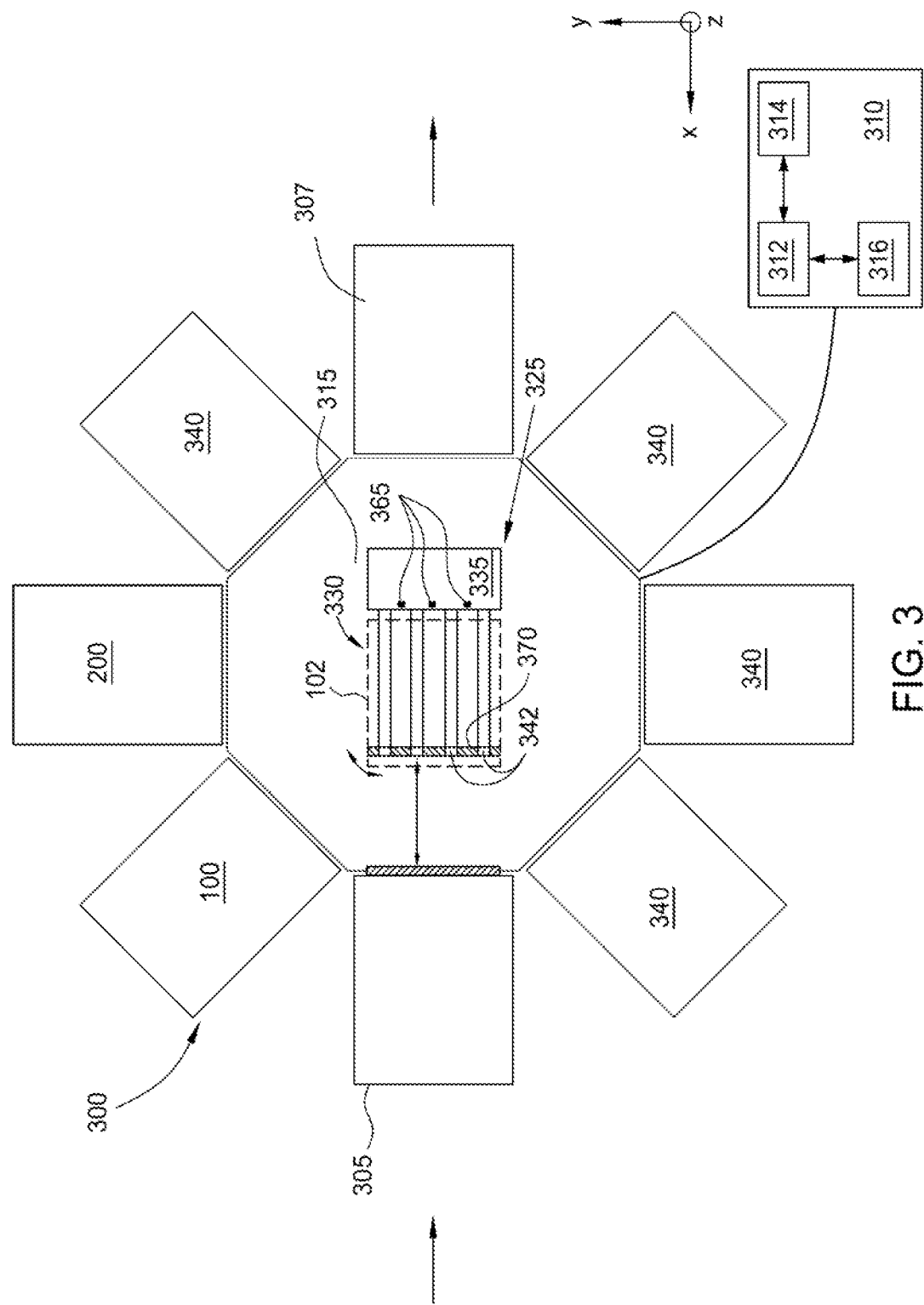
FIG. 3 is a schematic view of a multi-chamber substrate processing system including processing chambers described herein.

FIG. 3 is a top plan view of a multi-chamber integrated processing system 300 suitable for the fabrication of one or more layers of the layer stack disclosed herein. The layer stack may be incorporated into any suitable display devices, such as organic light emitting diodes (OLEDS), thin-film transistors (TFT), or thin-film encapsulation (TFE). The system 300 includes a plurality of processing chambers 100, 200, 340 and one or more load lock chambers 305, 307 positioned around a central transfer chamber 315. The processing chambers 100, 200, 340 are provided to complete a number of different processing steps to achieve a predetermined processing of flat media, such as a large area substrate 102 (outlined in dashed lines). In one embodiment, the processing chamber 100 is utilized for forming a dielectric layer and a high K dielectric layer on the dielectric layer, and the processing chamber 200 is utilized to anneal the high K dielectric layer. In another embodiment, the dielectric layer and the high K dielectric layer are formed in the processing chamber 340, which is a plasma enhanced chemical vapor deposition (PECVD) chamber, such as the AKT® 55KS PECVD chamber, available from Applied Materials, Inc., located in Santa Clara, Calif. The load lock chambers 305, 307 are configured to transfer a substrate in a quadrilateral form from an ambient environment outside the multi-chamber substrate processing system 300 to a vacuum environment inside the transfer chamber 315.

A transfer robot 325 having an end effector 330 is positioned in the transfer chamber 315. The end effector 330 is configured to be supported and move independently of the transfer robot 325 to transfer the substrate 102. The end effector 330 includes a wrist 335 and a plurality of fingers 342 adapted to support the substrate 102. The transfer robot 325 includes one or more optical image sensors 365 and 370 disposed on the transfer robot 325 as needed.

The processing chambers 340 incorporated in the multi-chamber substrate processing system 300 may be any suitable chambers, such as HDP-CVD, MOCVD, PECVD, ALD, PE-ALD thermal CVD, thermal annealing, PVD, surface treatment, electron beam (e-beam) treatment, plasma treatment, etching chambers, ion implantation chambers, surface cleaning chamber, metrology chambers, spin-coating chamber, polymer spinning deposition chamber, shadow frame storage chamber or any suitable chambers as needed. In one example depicted in the multi-chamber substrate processing system 300, the system 300 includes the chamber 100, the chamber 200, and other suitable chambers 340 as needed. By such arrangement, the dielectric layer formed by the PE-ALD process, the high K dielectric layer formed by the PE-ALD process, and the annealing of the high K dielectric layer are integrated to perform in a single system without breaking vacuum so as to maintain cleanliness of the substrate without undesired contamination and residuals from the environment.

A controller 310 may be coupled to various components of the multi-chamber substrate processing system 300 to control the operation thereof. The controller 310 includes a central processing unit (CPU) 312, a memory 314, and support circuits 316. The controller 310 may control the multi-chamber substrate processing system 300 directly, or via computers (or controllers) associated with particular process chamber and/or support system components. The controller 310 may be one or any form of general-purpose computer processor that can be used in an industrial setting for controlling various chambers and sub-processors. The memory, or computer readable medium, 314 of the controller 310 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 316 are coupled to the CPU 312 for supporting the processor in a conventional manner. These circuits include cache, power supplies, clock circuits, input/output circuitry and subsystems, and the like. Methods as described herein may be stored in the memory 314 as software routine that may be executed or invoked to control the operation of the multi-chamber substrate processing system 300 in the manner described herein. The software routine may also be stored and/or executed by a second CPU (not shown) that is remotely located from the hardware being controlled by the CPU 312.

Figure 4:
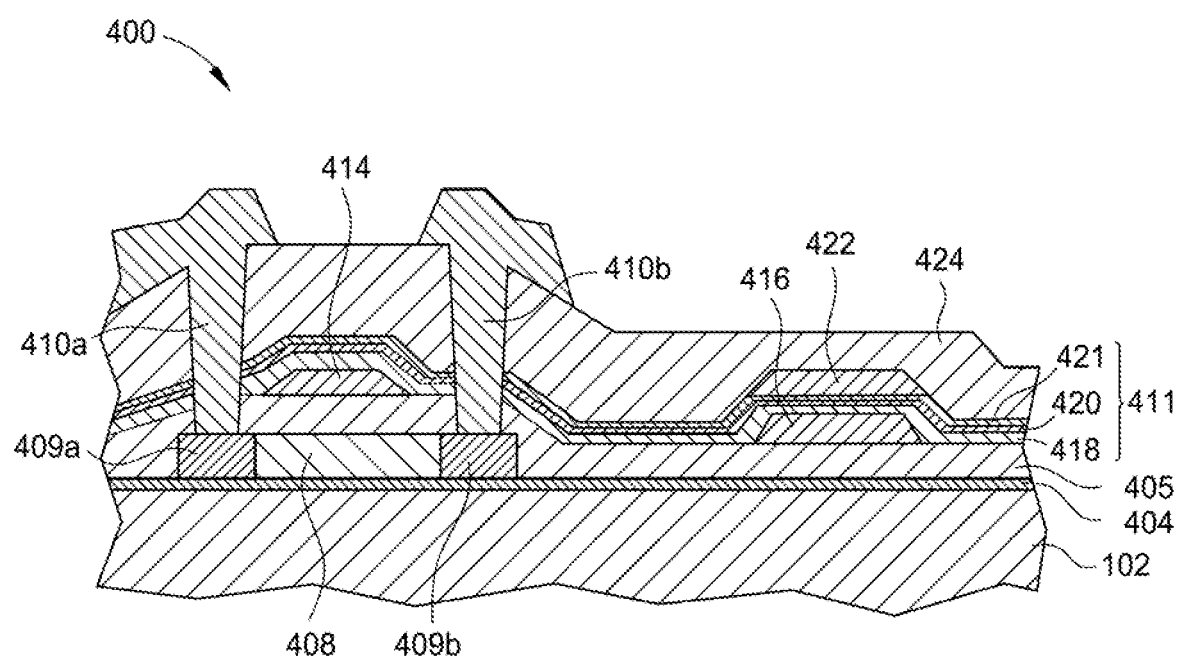
FIG. 4 is a cross-sectional view of a TFT device structure utilizing a layer stack in accordance with one embodiment of the present disclosure.

FIG. 4 is a cross-sectional view of a TFT device structure 400 utilizing a layer stack 411 according to one embodiment. As shown in FIG. 4, the TFT device structure 400 is formed on the substrate 102. The TFT device structure 400 is utilized for display devices, such as OLED devices. The TFT device structure 400 includes a source region 409a, channel region 408, and drain region 409b formed on the optically transparent substrate 102 with or without an optional insulating layer 404 disposed thereon. The source region 409a, channel region 408, and drain region 409b are generally formed from an initially deposited amorphous silicon (a-Si) layer that is typically later thermal or laser processed to form a polysilicon layer. The source region 409a, drain region 409b, and channel region 408 can be formed by patterning and ion doping the initially deposited a-Si layer, which is then thermally or laser processed to form the polysilicon layer. A gate insulating layer 405 is then deposited on the source region 409a, drain region 409b, and channel region 408, and a gate electrode 414 is deposited on the gate insulating layer 405. The gate insulating layer 405 is fabricated from a dielectric material, such as SiN or silicon dioxide ($SiO_2$). The gate electrode 414 may be fabricated from a metal, such as molybdenum (Mo). The gate electrode 414 may be a layer stack including two or more metal layers. In one embodiment, the gate electrode 414 includes an aluminum (Al) layer disposed between two titanium (Ti) layers. A metal electrode 416 is also deposited on the gate insulating layer 405. The metal electrode 416 may be fabricated from the same material as the gate electrode 414. In one embodiment, a metal layer is deposited on the gate insulating layer 405, and the metal layer is patterned to form the gate electrode 414 and the metal electrode 416.

A layer stack 411 including a dielectric layer 418, a high K dielectric layer 420, and an optional silicon nitride layer 421. The layer stack 411 is formed on the gate insulating layer 405, the gate electrode 414, and the metal electrode 416. The dielectric layer 418 is deposited on and in contact with the gate insulating layer 405, the gate electrode 414, and the metal electrode 416, the high K dielectric layer 420 is deposited on and in contact with the dielectric layer 418, and the optional silicon nitride layer 421 is deposited on and in contact with the high K dielectric layer 420. The dielectric layer 418 has a homogeneous surface compared to the surfaces of the gate insulating layer 405, the gate electrode 414 and the metal electrode 416. The homogeneous surface of the dielectric layer 418 provides an ideal surface which enables uniform deposition of the high K dielectric layer 420, resulting in a uniform thickness profile. The dielectric layer 418 is fabricated from a material different from the material of the high K dielectric layer 420. The dielectric layer 418 may be any suitable dielectric layer, such as an oxide, for example $SiO_2$, aluminum oxide ($Al_2O_3$), titanium dioxide ($TiO_2$), or yttrium (III) oxide ($Y_2O_3$). In one example, the dielectric layer 418 is the same dielectric material as the gate insulating layer 405. In another example, the dielectric layer 418 is a different dielectric material than the gate insulating layer 405. The dielectric layer 418 has a thickness ranging from about 2 Angstroms to about 100 Angstroms.

In one embodiment, the dielectric layer 418 is $TiO_2$ and has a thickness ranging from about 2 Angstroms to about 50 Angstroms. It has been discovered that when the dielectric layer 418 is $TiO_2$ and has a thickness ranging from about 2 Angstroms to about 50 Angstroms, the high K dielectric layer 420 deposited thereon has a cubic or tetragonal phase crystalline structure that provides a K value higher than conventionally deposited over the metal and dielectric surfaces. The high K dielectric layer 420 has a K value ranging from about 30 to about 50 when deposited on the $TiO_2$ dielectric layer 418. Furthermore, the deposition rate of the high K dielectric layer 420 deposited on the $TiO_2$ dielectric layer 418 is about five to about 20 percent higher than the deposition rate of the high K dielectric layer 420 on materials other than the $TiO_2$ dielectric layer under the same process conditions. The $TiO_2$ dielectric layer 418 additionally improves adhesion between the high K dielectric layer 420 and the surfaces of the gate insulating layer 405, the gate electrode 414 and the metal electrode 416.

In another embodiment, the dielectric layer 418 is amorphous $Al_2O_3$ having a thickness ranging from about 2 Angstroms to about 100 Angstroms. The high K dielectric layer 420 may be a $ZrO_2$ layer or hafnium dioxide ($HfO_2$) layer having a K value ranging from about 20 to about 50, and the high K dielectric layer 420 has a thickness ranging from about 250 Angstroms to about 900 Angstroms.

The dielectric layer 418 may be deposited on the gate insulating layer 405, the gate electrode 414 and the metal electrode 416 in a PE-ALD chamber, such as the chamber 100 shown in FIG. 1, and the high K dielectric layer 420 may be deposited on the dielectric layer 418 in the same PE-ALD chamber. The process conditions for depositing the dielectric layer 418 may be similar to the process conditions for depositing the high K dielectric layer 420. For example, the temperature of the substrate during the deposition of the dielectric layer 418 and during the deposition of the high K dielectric layer 420 is maintained at between about 150 degrees Celsius and about 300 degrees Celsius. The pressure of the processing chamber during the deposition of the dielectric layer 418 and during the deposition of the high K dielectric layer 420 is maintained at between about 0.1 Torr and about one Torr. In one embodiment, a titanium containing precursor, such as tetrakis(ethylmethylamino)titanium, and an oxygen containing precursor, such as oxygen gas, are alternately injected into the processing chamber to form the dielectric layer 418. In another embodiment, an aluminum containing precursor, such as trimethylaluminum, and an oxygen containing precursor, such as oxygen gas, are alternately injected into the processing chamber to form the dielectric layer 418. The high K dielectric layer 420 may be deposited by alternately injecting a zirconium containing precursor, such as tetrakis(ethylmethylamino)zirconium, and an oxygen containing precursor, such as oxygen gas, into the processing chamber.

In another embodiment, the dielectric layer 418 and the high K dielectric layer 420 can be deposited in a PECVD chamber, such as the AKT® 55KS PECVD chamber, available from Applied Materials, Inc., located in Santa Clara, Calif.

The high K dielectric layer 420 is annealed to increase the K value of the high K dielectric layer 420. In one embodiment, the high K dielectric layer 420 is annealed in the processing chamber in which the high K dielectric layer 420 is deposited. In another embodiment, the high K dielectric layer 420 is annealed in a thermal treatment chamber, such as the thermal treatment chamber 200 shown in FIG. 2. The high K dielectric layer 420 may be annealed in an inert or reactive environment at a temperature greater than 350 degrees Celsius, such as from about 350 degrees Celsius to about 650 degrees Celsius. The annealing temperature is correlated to the thickness of the high K dielectric layer 420. Thinner layer can lead to higher annealing temperature. In one embodiment, the high K dielectric layer 420 is annealed in the presence of an inert gas, such as $N_2$, Ar, or the combination thereof. In another embodiment, the high K dielectric layer 420 is annealed in the presence of an oxidation gas, such as $O_2$, $O_3$, or the combination thereof. In yet another embodiment, the high K dielectric layer 420 is annealed in the presence of at least an inert gas and a reactive gas. The annealing process may be performed immediately following the deposition of the high K dielectric layer 420 or after one or more layers subsequently formed on the high K dielectric layer 420. In one embodiment, the annealing process is performed after the optional silicon nitride layer 421 is deposited on the high K dielectric layer 420.

A second metal electrode 422 is disposed on the layer stack 411, and the second metal electrode 422 may be fabricated from the same material as the metal electrode 416 or from a different material than the metal electrode 416. The metal electrode 416, the layer stack 411, and the second metal electrode 422 may form a MIM capacitor. After the MIM capacitor is formed, an interlayer dielectric 424 is formed on the second metal electrode 422 and the layer stack 411. The interlayer dielectric 424 may be any suitable dielectric layer, such as silicon oxide or silicon nitride. A source metal electrode layer 410a and a drain metal electrode layer 410b are formed through the interlayer dielectric 424, the layer stack 411, and the gate insulating layer 405, and are electrically connected to the source region 409a and drain region 409b, respectively.

By depositing a dielectric layer on a metal surface and a dielectric surface and depositing a high K dielectric layer thereon, the uniformity of the thickness profile of the high K dielectric layer is improved, the K value can be increased and better adhesion of the high K dielectric layer can be achieved. For example, if the dielectric layer is $TiO_2$, additional benefits such as higher K value, higher deposition rate of the high K dielectric layer, and improved adhesion can be obtained.

While the foregoing is directed to embodiments of the disclosure, other and further embodiments may be devised without departing from the basic scope thereof, and the scope thereof is determined by the claims that follow.

What is claimed is:
1. A structure, comprising:
a first metal electrode disposed on a first dielectric layer; and a layer stack disposed on the first dielectric layer and the first metal electrode, the layer stack comprising:
a second dielectric layer disposed on and in contact with the first dielectric layer and the first metal electrode;
a high K dielectric layer disposed on and in contact with the second dielectric layer, wherein:
the high K dielectric layer is distinct from the second dielectric layer;
the high K dielectric layer comprises zirconium dioxide or hafnium dioxide;
the high K dielectric layer is in contact with the second dielectric layer at a location over the first metal electrode; and
the high K dielectric layer has a thickness of about 250 Angstroms to about 900 Angstroms; and
a silicon nitride layer disposed on and in contact with the high K dielectric layer.

2. The structure of claim 1, wherein the high K dielectric layer comprises zirconium dioxide.

3. The structure of claim 1, wherein the high K dielectric layer has a cubic or tetragonal phase crystalline structure.

4. The structure of claim 1, wherein the second dielectric layer comprises silicon dioxide, aluminum oxide, titanium dioxide, or yttrium oxide.

5. The structure of claim 1, wherein the second dielectric layer has a thickness of about 2 Angstroms to about 100 Angstroms.

6. The structure of claim 1, wherein the first dielectric layer comprises the same material as the second dielectric layer.

7. The structure of claim 1, wherein the first dielectric layer comprises silicon nitride or silicon dioxide.

8. The structure of claim 1, wherein the first metal electrode comprises an aluminum layer or a molybdenum layer.

9. The structure of claim 1, wherein the first metal electrode comprises an aluminum layer disposed between two titanium layers.

10. The structure of claim 1, further comprising:
a second metal electrode conformally disposed on and in contact with the silicon nitride layer; and
a third dielectric layer conformally disposed on the second metal electrode.

11. A structure, comprising:
a first metal electrode disposed on a first dielectric layer; and
a layer stack disposed on the first dielectric layer and the first metal electrode, the layer stack comprising:
a second dielectric layer disposed on and in contact with the first dielectric layer and the first metal electrode, the second dielectric layer comprising a different material than the first dielectric layer;
a high K dielectric layer disposed on and in contact with the second dielectric layer, wherein:
the high K dielectric layer is distinct from the second dielectric layer;
the high K dielectric layer comprises zirconium dioxide and has a cubic or tetragonal phase crystalline structure; and
the high K dielectric layer is in contact with the second dielectric layer at a location over the first metal electrode; and
a silicon nitride layer disposed on and in contact with the high K dielectric layer.

12. The structure of claim 11, wherein the high K dielectric layer has a thickness of about 250 Angstroms to about 900 Angstroms.

13. The structure of claim 11, wherein the second dielectric layer comprises silicon dioxide, aluminum oxide, titanium dioxide, or yttrium oxide.

14. The structure of claim 11, wherein the second dielectric layer has a thickness of about 2 Angstroms to about 100 Angstroms.

15. The structure of claim 11, wherein the first dielectric layer comprises silicon nitride or silicon dioxide.

16. The structure of claim 11, wherein the first metal electrode comprises an aluminum layer or a molybdenum layer.

17. The structure of claim 11, wherein the first metal electrode comprises an aluminum layer disposed between two titanium layers.

18. The structure of claim 11, further comprising:
a second metal electrode conformally disposed on and in contact with the silicon nitride layer; and
a third dielectric layer conformally disposed on the second metal electrode.

19. A structure, comprising:
a first metal electrode disposed on a first dielectric layer, wherein the first metal electrode comprises an aluminum layer or a molybdenum layer; and
a layer stack disposed on the first dielectric layer and the first metal electrode, the layer stack comprising:
a second dielectric layer disposed on and in contact with the first dielectric layer and the first metal electrode, wherein the second dielectric layer comprises silicon dioxide, aluminum oxide, titanium dioxide, or yttrium oxide;
a high K dielectric layer disposed on and in contact with the second dielectric layer, wherein:
the high K dielectric layer is distinct from the second dielectric layer;
the high K dielectric layer comprises zirconium dioxide or hafnium dioxide and has a cubic or tetragonal phase crystalline structure; and
the high K dielectric layer is in contact with the second dielectric layer at a location over the first metal electrode; and
a silicon nitride layer disposed on and in contact with the high K dielectric layer.

20. The structure of claim 19, further comprising:
a second metal electrode conformally disposed on and in contact with the silicon nitride layer; and
a third dielectric layer conformally disposed on the second metal electrode.

* * * * *